United States Patent [19]

O'Handley

[11] 4,150,981

[45] Apr. 24, 1979

[54] GLASSY ALLOYS CONTAINING COBALT, NICKEL AND IRON HAVING NEAR-ZERO MAGNETOSTRICTION AND HIGH SATURATION INDUCTION

[75] Inventor: Robert C. O'Handley, Morris Plains, N.Y.

[73] Assignee: Allied Chemical Corporation, Morris Township, Morris County, N.J.

[21] Appl. No.: 824,590

[22] Filed: Aug. 15, 1977

[51] Int. Cl.² ........................ C22C 19/07; C22C 19/00

[52] U.S. Cl. ........................ 75/170; 75/134 F

[58] Field of Search ........................ 75/134 F, 170

[56] References Cited

U.S. PATENT DOCUMENTS

| | | | |
|---|---|---|---|
| 3,856,513 | 12/1974 | Chen et al. | 75/170 |
| 4,036,638 | 7/1977 | Ray et al. | 75/170 |
| 4,038,073 | 7/1977 | O'Handley et al. | 75/170 |
| 4,052,201 | 10/1977 | Polk | 75/124 |
| 4,056,411 | 11/1977 | Chen et al. | 75/170 |
| 4,067,732 | 1/1978 | Ray | 75/170 |

OTHER PUBLICATIONS

Magnetism and Magnetic Materials-1977, "Amorphous Alloys as Soft Magnetic Materials", Egami, et al.

*Primary Examiner*—Arthur J. Steiner

*Attorney, Agent, or Firm*—Ernest D. Buff; Gerhard H. Fuchs

[57] ABSTRACT

Glassy alloys containing cobalt, nickel and iron and evidencing near-zero magnetostriction and high saturation induction are disclosed. The glassy alloys consist essentially of about 13 to 73 atom percent cobalt, about 5 to 50 atom percent nickel, about 2 to 17 atom percent iron, with the proviso that the total of cobalt, nickel and iron is about 80 atom percent, and the balance essentially boron plus incidental impurities. The magnetostriction of the glassy alloys ranges from about $+3\times10^{-6}$ to $-3\times10^{-6}$ and the saturation induction is at least about 8 kGauss.

6 Claims, 2 Drawing Figures

GLASSY ALLOYS CONTAINING COBALT, NICKEL AND IRON HAVING NEAR-ZERO MAGNETOSTRICTION AND HIGH SATURATION INDUCTION

BACKGROUND OF THE INVENTION

1. Field of the Invention

This invention relates to glassy alloys containing cobalt, nickel and iron and evidencing near-zero magnetostriction and high saturation induction.

2. Description of the Prior Art

Saturation magnetostriction $\lambda_s$ is related to the fractional change in length $\Delta l/l$ that occurs in a magnetic material on going from the demagnetized to the saturated, ferromagnetic state. The value of magnetostriction, a dimensionless quantity, is often given in units of microstrains (i.e., a microstrain is a fractional change in length of one part per million).

Ferromagnetic alloys of low magnetostriction are desirable for several interrelated reasons:

1. Soft dc magnetic properties (low coercivity, high permeability) are generally obtained when both the saturation magnetostriction $\lambda_s$ and the magnetocrystalline anisotropy K approach zero. Therefore, given the same anisotropy, alloys of lower magnetostriction will show lower dc coercivities and higher permeabilities. Such alloys are suitable for magnetostatic shields, magnetic switching devices or various other soft magnetic applications.

2. Magnetic properties of such zero magnetostrictive materials are insensitive to mechanical strains. Therefore, when $\lambda \simeq 0$, there is no need for stress-relief annealing after winding, punching or other physical handling needed to form a device from such material. In contrast, magnetic properties of stress-sensitive materials, such as amorphous or crystalline alloys with finite magnetostriction, are seriously degraded by such cold working and must be carefully annealed.

3. The low dc coercivity of zero magnetostriction materials carries over to ac operating conditions where again low coercivity and high permeability are realized (provided the magnetocrystalline anisotropy is not too large and the resistivity not too small). Also, because energy is not lost to mechanical vibrations when the saturation magnetostriction is zero, the core loss of zero-magnetostriction materials can be quite low. Thus, zero-magnetostriction magnetic alloys (of moderate or low magnetocrystalline anisotropy) are useful where low loss and high ac permeability are required. Such ac applications include a variety of tape-wound and laminated core devices, such as signal and power transformers, magnetic amplifiers, inductors, invertors and tape heads.

4. Finally, electromagnetic devices containing zero magnetostrictive materials generate no acoustic noise under ac excitation. While this is the reason for the lower core loss mentioned above, it is also a desirable characteristic in itself because it eliminates the hum inherent in many electromagnetic devices.

There are three well-known crystalline alloys of zero magnetostriction (in atom percent, unless otherwise indicated):

(1) Nickel-iron alloys containing approximately 80% nickel ("80 nickel permalloys");

(2) Cobalt-iron alloys containing approximately 90% cobalt; and (3) Iron-silicon alloys containing approximately 6 wt.% silicon.

Also included in these categories are zero magnetostriction alloys based on the binaries but with small additions of other elements such as molybdenum, copper or aluminum to provide specific property changes. These include, for example, 4% Mo, 79% Ni, 17% Fe (sold under the designation Moly Permalloy) for increased resistivity and permeability; permalloy plus varying amounts of copper (sold under the designation Mumetal) for magnetic softness and improved ductility; and 85 wt.% Fe, 9 wt.% Si, 6 wt.% Al (sold under the designation Sendust) for zero anisotropy.

The alloys included in (1) are the most widely used of the three classes listed above because they combine zero magnetostriction with low anisotropy and are, therefore, extremely soft magnetically; that is they have a low coercivity $H_c$, a high permeability and a low core loss. These permalloys are also relatively soft mechanically so that they are easily rolled into sheet form, cut into tape form, and stamped into laminations. However, their mechanical softness (yield stress $\sigma_Y$ of, e.g., 4-79% Moly Permalloy is about 15 kg/mm$^2$) is also a disadvantage inasmuch as it renders the magnetic properties of the material susceptible to degradation upon handling because of stresses which exceed $\sigma_Y$; that is, only relatively small stresses are needed to plastically deform crystalline Fe—Ni alloys. Further, these materials have low saturation inductions ($B_s$) ranging only from about 6 to 8 kGauss, which is a drawback in many applications. For example, if a given voltage V is required at the secondary of a signal transformer or a power transformer, then Faraday's law, $V \propto -NA\Delta Bf$, shows that for a fixed frequency "f" and number of secondary turns N, the cross-sectional area A of core material may be reduced if a larger change in flux density $\Delta B$ can be had by using a material of greater $B_s$. The use of less core material obviously reduces the size, weight and cost of the device as well as reducing both the amount of wire needed to obtain N winding turns and the loss in that wire.

(2) Alloys based on $Co_{90}Fe_{10}$ have a much higher saturation induction ($B_s$ about 19 kGauss) than the permalloys. However, they also have a strong negative magnetocrystalline anisotropy, which prevents them from being good soft magnetic materials. For example, the initial permeability of $Co_{90}Fe_{10}$ is only about 100 to 200.

(3) Fe/6 wt.% Si and the related ternary alloy Sendust (mentioned above) also show higher saturation inductions ($B_s$ about 18 kGauss and 11 kGauss, respectively) than the permalloys. However, these alloys are extremely brittle and have therefore, found limited use in powder form only.

The first two crystalline alloys mentioned above ($Ni_{80}Fe_{20}$ and $Co_{90}Fe_{10}$) form the end members of a discontinuous series of ternary Fe—Co—Ni zero magnetostrictive, crystalline alloys. The $\lambda = 0$ branches near $Co_{90}Fe_{10}$ suffer from high anisotropy, and those near $Ni_{80}Fe_{20}$ suffer from low saturation induction.

Clearly desirable are zero-magnetostriction alloys of higher saturation induction than the permalloys but retaining low magnetic anisotropy and good ductility.

It is known that magnetocrystalline anisotropy is effectively eliminated in the glassy state. The remaining sources of anisotropy are relatively weak. It is, therefore, desirable to seek glassy metal alloys of zero magnetostriction. Such alloys might be found near the compositions listed above. Because of the presence of metalloids which tend to quench the magnetization by the transfer of charge to the transition-metal d-electron states, however, glassy metal alloys based on the 80% nickel permalloys are either non-ferromagnetic at room temperature or have unacceptably low saturation inductions. For example, the glassy alloy $Fe_{40}Ni_{40}P_{14}B_6$ (the subscripts are in atom percent), for which $\lambda_s=11\times10^{-6}$, has a saturation induction of about 8 kGauss, while the glassy alloy $Ni_{49}Fe_{29}P_{14}B_6Si_2$, for which $\lambda_s=3\times10^{-6}$ has a saturation induction of about 4.6 kGauss and the glassy alloy $Ni_{80}P_{20}$ is non-ferromagnetic. No glassy metal alloys having a saturation magnetostriction approximately equal to zero have yet been found near the iron-rich Sendust composition. Three zero magnetostrictive glassy metal alloys based on the Co—Fe crystalline alloy mentioned above in (2) have been reported in the literature. These are $Co_{72}Fe_3P_{16}B_6Al_3$ (AIP Conference Proceedings, No. 24, pp. 745–746 (1975)), $Co_{71}Fe_4Si_{15}B_{10}$ (Vol. 14, Japanese Journal of Applied Physics, pp. 1077–1078 (1975)) and $Co_{74}Fe_6B_{20}$ (Vol. MAG. 12, *IEEE Transactions of Magnetics,* pp. 942–944 (1976); see also U.S. Pat. No. 4,038,073, issued July 26, 1977). Table I lists some of the magnetic properties of these materials.

TABLE I

| | $Co_{72}Fe_3P_{16}B_6Al_3$ | $Co_{71}Fe_4Si_{15}B_{10}$ | $Co_{74}Fe_6B_{20}$ |
|---|---|---|---|
| $B_s$ (kGauss) | 6.0 | 6.4 | 11.8 |
| $H_c$ (as quenched) (Oe) | 0.023 | 0.01 | 0.03 |
| $B_r$ (as quenched) (kGauss) | 2.84 | 2.24 | 9.8 |
| $H_c$ (field annealed) (Oe) | 0.013* | 0.015** | — |
| $B_r$ (field annealed)(kGauss) | 4.5* | 5.25** | — |
| $T_C$ (K) | 650 | 688 | 760–810 |

*field annealed at 270° C. for 45 min in 30 Oe applied longitudinally.
**field annealed at 350° C. and cooled at 175° C./hr in 400 Oe applied longitudinally.

These glassy alloys evidence low coercivities and are expected to have high permeabilities and low core loss, because the saturation magnetostriction is approximately zero and, generally, in a glassy state the magnetocrystalline anisotropy is very small and the resistivity is high. However, the saturation inductions of the first two glassy alloys are at the lower limit of the range spanned by various high-nickel cyrstalline alloys. Thus, they offer little improvement over the properties of the crystalline permalloys. The third non-magnetostrictive glassy alloy listed in Table I shows high saturation induction and high remanance ($B_r$ about 10 kGauss) in addition to low coercivity (about 0.03 Oe).

The magnetostriction behavior of glassy alloys containing iron, cobalt and nickel is disclosed in the AIP Conference Proceedings cited above for $(Fe,Co,Ni)_{0.75}(P,B,Al)_{0.25}$. These alloys, however, evidence low saturation induction (about 8 kGauss and less) in the high cobalt region.

SUMMARY OF THE INVENTION

In accordance with the invention, magnetic alloys that are substantially glassy are provided having a near-zero magnetostriction and a high saturation induction. The glassy alloys of the invention consist essentially of about 13 to 73 atom percent cobalt, about 5 to 50 atom percent nickel, about 2 to 17 atom percent iron, with the proviso that the total of cobalt, nickel and iron is about 80 atom percent, and the balance essentially boron plus incidental impurities. The glassy alloys have a value of magnetostriction ranging from about $+3\times10^{-6}$ to $-3\times10^{-6}$ and a saturation induction of at least about 8 kGauss.

DETAILED DESCRIPTION OF THE INVENTION

Figure 1:
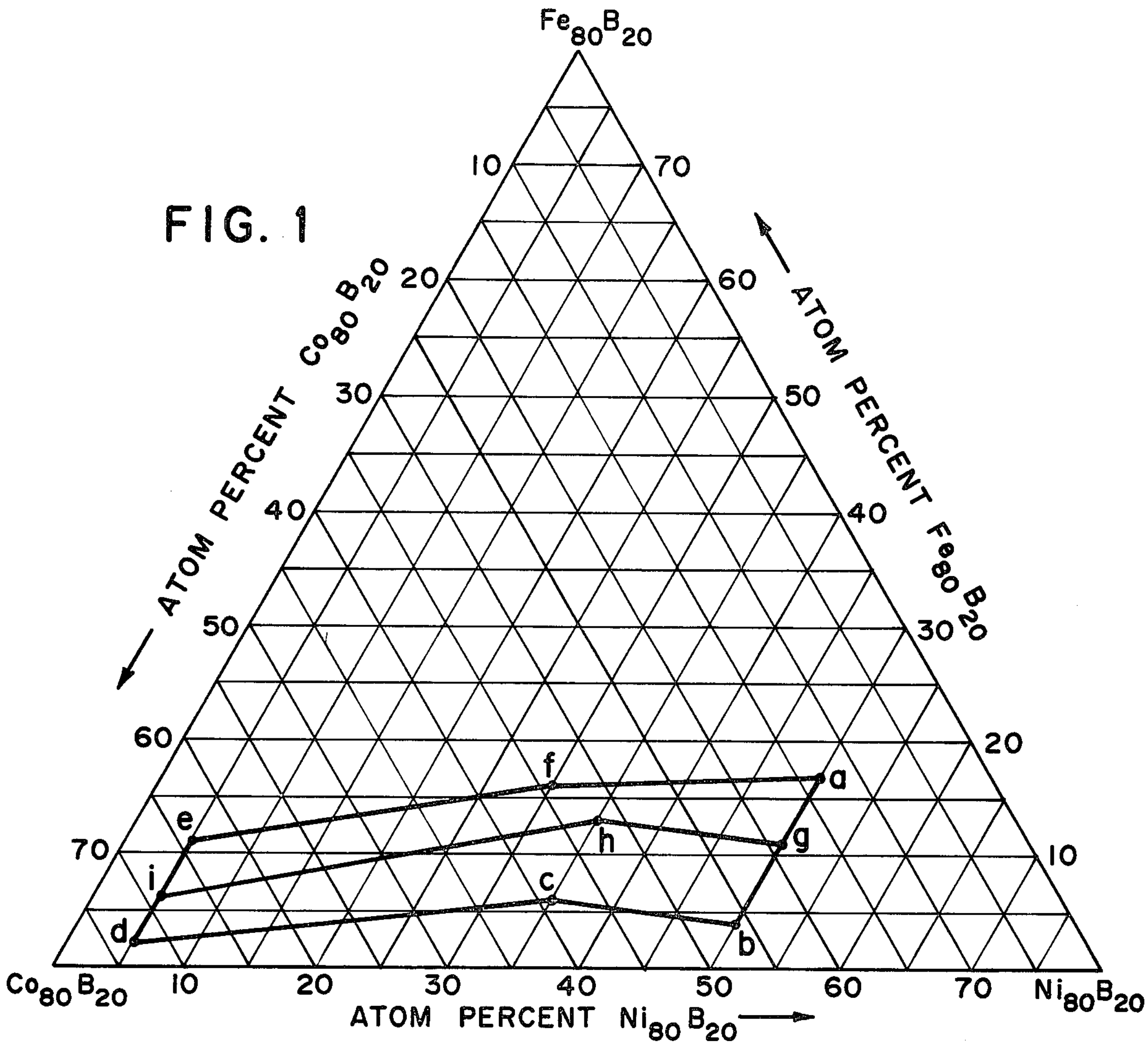
FIG. 1, on coordinates of atom percent, is a pseudoternary composition diagram of the Fe—Co—Ni—B system and depicts the composition range of $(Fe,Co,Ni)_{80}B_{20}$ alloys for which the magnetostriction varies from $+3\times10^{-6}$ to $-3\times10^{-6}$.

In accordance with the invention, magnetic alloys that are substantially glassy are provided having a near-zero magnetosriction and a high saturation induction. The glassy alloys of the invention consist essentially of about 13 to 73 atom percent cobalt, about 5 to 50 atom percent nickel, about 2 to 17 atom percent iron, with the proviso that the total of cobalt, nickel and iron is about 80 atom percent, and the balance essentially boron plus incidental impurities. The composition range of the glassy alloys is more fully shown in FIG. 1, which depicts iron-cobalt-nickel-boron glassy alloys having a magnetostriction ranging from $+3\times10^{-6}$ to $-3\times10^{-6}$. The composition range of the glassy alloys of the invention is encompassed by the polygon a-b-c-d-e-f-a, having at its corners the points approximately by:

| | Atom percent | | | | Weight percent | | | |
|---|---|---|---|---|---|---|---|---|
| | Co | Ni | Fe | B | Co | Ni | Fe | B |
| a. | 13 | 50 | 17 | 20 | 16 | 60 | 20 | 4 |
| b. | 26 | 50 | 4 | 20 | 31 | 60 | 5 | 4 |
| c. | 39 | 35 | 6 | 20 | 47 | 42 | 7 | 4 |
| d. | 73 | 5 | 2 | 20 | 87 | 6 | 2 | 4 |
| e. | 64 | 5 | 11 | 20 | 77 | 6 | 13 | 4 |
| f. | 34 | 30 | 10 | 20 | 41 | 36 | 18 | 4 |

The addition of at least about 5 atom percent nickel to cobalt-iron-boron glassy alloys results in three effects:

1. The zero magnetostriction line moves toward the $Fe_{80}B_{20}$ corner. Thus, these zero magnetostriction compositions contain more iron than $Co_{75}Fe_5B_{20}$ and have correspondingly higher saturation inductions, greater than about 8 kGauss.

2. The glassy alloys become easier to fabricate.

3. The glassy alloys become more susceptible to field annealing and thus to a tailoring of their low field magnetic properties. However, further additions of nickel decrease the saturation induction, the Curie temperature and the crystallization temperature. Above about 50 atom percent nickel, the metallic glasses have low saturation inductions, low Curie temperatures, low crystallization temperatures and are difficult to fabricate. For example, the glassy alloy $Co_{10}Ni_{60}Fe_{10}B_{20}$ has a saturation induction of 3.0 kGauss, a Curie temperature of 430 K and a crystallization temperature of 635 K. Since the highest saturation inductions are obtained for these alloys over the region of about 10 to 40 atom percent nickel, such compositions are preferred.

The purity of the alloys of the invention is that found in normal commercial practice. However, it will be appreciated that the alloys of the invention may contain, based on total composition, up to about 4 atom percent of at least one another transition metal element, such as titanium, tungsten, molybdenum, chromium, manganese and copper, and up to about 6 atom percent of at least one other metalloid element, such as silicon, aluminum, carbon and phosphorus, without significantly degrading the desirable magnetic properties of these glassy alloys.

Examples of essentially zero magnetostriction glassy alloys of the invention include $Co_{56}Ni_{16}Fe_8B_{20}$, $Co_{44}Ni_{24}Fe_{12}B_{20}$, $Co_{34}Ni_{34}Fe_{12}B_{20}$ and $Co_{28}Ni_{36}Fe_{16}B_{20}$. These glassy alloys possess low magnetic anisotropy because of their glassy structure, yet still retain a high saturation induction (greater than that of the permalloys—about 8 kGauss) and excellent ductility. Data on some magnetic properties of the glassy alloys of the invention are listed in Table II. For comparison, magnetic data on two glassy alloys outside the scope of the invention, $Co_{74}Fe_6B_{20}$ and $Co_{10}Ni_{60}Fe_{10}B_{20}$, are included. These data may be compared with properties listed in Table I for previously-reported glassy alloys of zero magnetostriction. $T_C$ and $T_X$ are the Curie and crystallization temperatures, respectively.

TABLE II

| $\lambda_s$ ($10^{-6}$) | Composition (at. %) | $B_s$ (kGauss) | $T_C$ (K) | $T_X$ (K) | as-wound/as-cast $H_c$ (Oe) | as-wound/as-cast $B_r$ (kGauss) |
|---|---|---|---|---|---|---|
| Outside scope of invention: | | | | | | |
| +0.4 | $Co_{74}Fe_6B_{20}$ | 11.8 | >750 | 695 | 0.030 | 9.8 |
| +1.0 | $Co_{10}Ni_{60}Fe_{10}B_{20}$ | 3.0 | 430 | 635 | 0.063 | 0.4 |
| Inside scope of invention: | | | | | | |
| −1.0 | $Co_{56}Ni_{16}Fe_8B_{20}$ | 9.8 | >750 | 685 | 0.025 | 8.9 |
| +1.0 | $Co_{44}Ni_{24}Fe_{12}B_{20}$ | 10.1 | 660 | 675 | 0.036 | 6.25 |
| −1.2 | $Co_{34}Ni_{34}Fe_{12}B_{20}$ | 8.1 | ~630 | 660 | 0.028 | 4.55 |
| +3.0 | $Co_{28}Ni_{36}Fe_{16}B_{20}$ | 7.8 | 630 | 670 | 0.055 (0.030)* | 4.0 (7.25)* |

*Field annealed by heating to 325° C. in vacuum and cooling slowly with H(circumferential) ≃10 Oe.

Unlike crystalline permalloys which are mechanically very soft, the zero magnetostriction glassy alloys of the invention are mechanically hard, as characterized, e.g., by their high yield stresses ($\sigma_Y$ ranges from about 350 kg/mm² for the cobalt-rich glasses to about 300 kg/mm² for the nickel-rich glasses, or more than 20 times the values for 4–79% Moly Permalloy).

Figure 2:
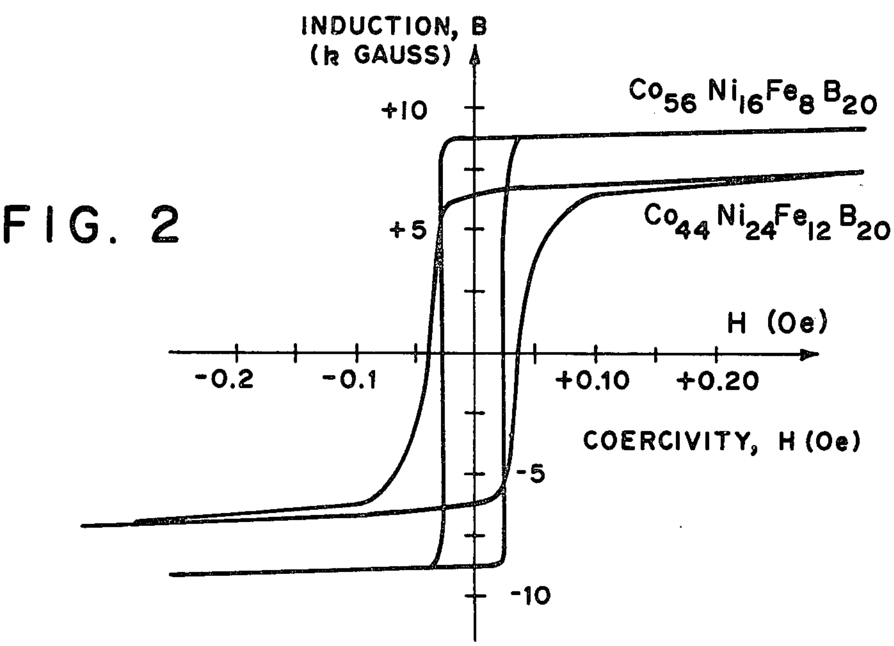
FIG. 2, on coordinates of kGauss and Oersteds, depicts the B—H loops for two as-wound/as-cast toroids having a low magnetostriction composition of the invention.

The dc hysteresis loops for as-wound/as-quenched toroids of two of these metallic glasses, $Co_{56}Ni_{16}Fe_8B_{20}$ and $Co_{44}Ni_{24}Fe_{12}B_{20}$, are shown in FIG. 2. The high saturation induction of these alloys relative to the first two glassy alloys shown in Table I results partially from the use of boron as the sole metalloid. In general, the glassy metal alloys of the invention have considerably higher saturation inductions and Curie temperatures than other glassy metal alloys of the same transition metal content but containing primarily metalloids other than boron. Without subscribing to any particular theory, these unexpected, improved properties are apparently obtained due to the presence of boron, which transfers less charge to the transition metal d-bands than the other metalloid elements.

Smaller values of magnetostriction are obtained in a narrow band of about +2 atom percent about the line g-h-i in FIG. 1. Such compositions have a magnetostriction ranging from about $+1\times10^{-6}$ to $-1\times10^{-6}$, and accordingly are preferred. Compositions having a substantially zero magnetostriction are obtained along the lines g-h-i and, accordingly, are most preferred. The coordinates of lines g-h-i are as follows

| | Atom percent Co | Ni | Fe | B | Weight percent Co | Ni | Fe | B |
|---|---|---|---|---|---|---|---|---|
| g. | 19 | 50 | 11 | 20 | 23 | 60 | 13 | 4 |
| h. | 32 | 35 | 13 | 20 | 39 | 42 | 15 | 4 |
| i. | 69 | 5 | 6 | 20 | 83 | 6 | 7 | 4 |

If lower Curie temperatures are desired, the glassy alloys with larger amounts of nickel are suitable. Rounder B—H loops often occur for such materials, as indicated in FIG. 2.

As nickel content is increased in these alloys, however, the crystallization temperature $T_X$ decreases, as shown in Table III, and alloy fabricability becomes increasingly difficult.

The glassy alloys of the invention are conveniently prepared by techniques readily available elsewhere; see, e.g., U.S. Pat. Nos. 3,845,805, issued Nov. 5, 1974 and 3,856,513, issued Dec. 24, 1974. In general, the glassy alloys, in the form of continuous ribbon, wire, etc., are rapidly quenched from a melt of the desired composition at a rate of at least about $10^5$K/sec.

Boron-containing glassy alloys have the highest saturation inductions and Curie temperatures, compared with other metalloid elements. However, the effect of the metalloids on the magnetostriction is slight for the glassy alloys of the invention having low nickel content. Zero magnetostriction is realized for a Co:Fe ratio of approximately 11.5:1 in the crystalline alloys ($Co_{92}Fe_8$) as well as in glassy alloys such as $Co_{73.6}Fe_{6.4}B_{20}$ and $Co_{73.6}Fe_{6.4}B_{14}C_6$. In the prior art glassy alloys containing the the metalloids of silicon, phosphorus, aluminum and boron, the Co:Fe ratio of $\lambda_s=0$ increases somewhat to 14:1, as represented in the composition $Co_{70}Fe_5M_{25}$. It is not clear whether this change is due to the lower transition metal/metalloid ratio in these glasses or to the presence of the other metalloids. It is clear, however, that this shift in the zero-magnetostriction composition is not as significant as the metalloid effects on the saturation induction and the Curie temperature. On the other hand, various metalloids appear to have a stronger effect on the high nickel compositions having substantially zero magnetostriction. In such cases, the line h-g in FIG. 1 is more sensitive to metalloid content than the line i-h.

Table III provides a comparison of relevant magnetic properties of zero magnetostriction alloys of the invention with alloys of the prior art. Approximate values of ranges are given for saturation induction $B_s$, magnetocrystalline anisotropy K and coercivity $H_c$ of several alloys of zero magnetostriction, including the new glassy metal alloys disclosed herein. Low coercivity is obtained only when both $\lambda_s$ and K approach zero. The large negative anisotropy of the crystalline Co—Fe alloy is a drawback in this regard. This large anisotropy may be overcome by making a glassy metal composition of approximately the same Co:Fe as the crystalline aloys shown in Table III. Zero magnetostriction is still retained. However, the presence of the metalloids P, Si and Al dilute and degrade the ferromagnetic state to the extent that the available flux density is low. The glassy alloys of the invention, in contrast, possesses zero and near-zero magnetostriction with significantly improved flux density relative to the 80% nickel alloys. It is expected that the development of proper annealing procedures will further improve the coercivity and permeability.

TABLE III

| Alloy Composition (Atom Percent) | $B_s$ (kGauss) | K ($10^3$ erg/cm$^3$) | $H_c$ (Oe) |
|---|---|---|---|
| Prior Art Crystalline | | | |
| 78-80% Ni* | 6 to 8 | −1 | 0.01 |
| 88-94% Co* | 19 | $-10^3$ | — |
| 9% Si, 6% Al* (wt.%) | 11 | 0 | 0.05 |
| Prior Art Glassy | | | |
| $Co_{72}Fe_3P_{16}B_6Al_3$ | 7 | +1 | 0.013 |
| $Co_{71}Fe_4Si_{15}B_{10}$ | 6 | +1 | 0.013 |
| $Co_{74}Fe_6B_{20}$ | 11.8 | +1 | 0.03 |
| This Invention, Glassy | | | |
| $Co_{56}Ni_{16}Fe_8B_{20}$ | 9.8 | +1 | 0.025 |
| $Co_{44}Ni_{24}Fe_{12}B_{20}$ | 10.1 | +1 | 0.036 |

*balance Fe

EXAMPLES

1. Sample Preparation

The glassy alloys were rapidly quenched (about $10^6$K/sec) from the melt following the techniques taught by Chen and Polk in U.S. Pat. No. 3,856,513. The resulting ribbons, typically 50 $\mu$m×1 mm in cross-section, were determined to be free of significant crystallinity by X-ray diffractometry (using CuKa radiation) and scanning calorimetry. Ribbons of the glassy metal alloys were strong, shiny, hard and ductile.

2. Magnetic Measurements

Continuous ribbons of the glassy metal alloys 6 to 10 m in length were wound onto bobbins (3.8 cm O.D.) to form closed-magnetic-path toroidal samples. Each sample contained from 1 to 3 g of ribbon. Insulated primary and secondary windings (numbering at least 100 each) were applied to the toroids. These samples were used to obtain hysteresis loops (coercivity and remanance) and initial permeability with a commercial curve tracer and core loss (IEEE Standard 106-1972).

The saturation induction, $B_s = H + 4\pi M_s$, was measured with a commercial vibrating sample magnetometer (Princeton Applied Research). In this case, the ribbon was cut into several small squares (approximately 1 mm×1 mm). These were randomly oriented about their normal direction, their plane being parallel to the applied field (0 to 9 kOe).

Magnetization versus temperature was measured from 4.2 to 1000 K in an applied field of 8 kOe in order to obtain the saturation moment per metal atom $n_B$ and Curie temperature, $T_C$.

For the glassy alloy $Co_{56}Ni_{16}Fe_8B_{20}$, the Curie temperature was greater than the crystallization temperature (see Table II). Hence, $T_C$ was estimated by extrapolation to zero of the magnetization in the glassy state.

Magnetostriction measurements employed semiconductor strain gauges (BLH Electronics) and in some cases metal foil gauges, which were bonded (Eastman - 910 Cement) between two short lengths of ribbon. The ribbon axis and gauge axis were parallel. The magnetostriction was determined as a function of applied field from the longitudinal strain in the parallel ($\Delta l/l_{\parallel}$) and perpendicular ($\Delta l/l_{\perp}$) in-plane fields according to the formula $\lambda = \frac{2}{3}(\Delta l/l_{81} - \Delta l/l_{195})$.

What is claimed is:

1. A magnetic alloy that is substantially glassy, consisting essentially of about 13 to 73 atom percent cobalt, about 5 to 50 atom percent nickel, about 2 to 17 atom percent iron, with the proviso that the total of cobalt, nickel and iron is about 80 atom percent, and the balance essentially boron plus incidental impurities, said alloy having a value of magnetostriction ranging from about $+3\times10^{-6}$ to $-3\times10^{-6}$ and a saturation induction of at least about 8 kGauss.

2. The magnetic alloy of claim 1 in which nickel ranges from about 10 to 40 atom percent.

3. The magnetic alloy of claim 1 which is bounded by the polygon a-b-c-d-e-f-a shown in FIG. 1 of the attached drawings.

4. The magnetic alloy of claim 3 in which the composition lies within about ±2 atom percent of the line g-h-i of FIG. 1 of the attached drawings.

5. The magnetic alloy of claim 4 in which the composition lies substantially on the line g-h-i of FIG. 1 of the attached drawings.

6. The magnetic alloy of claim 1 selected from the group consisting of $Co_{56}Ni_{16}Fe_8B_{20}$, $Co_{44}Ni_{24}Fe_{12}B_{20}$, $Co_{34}Ni_{34}Fe_{12}B_{20}$ and $Co_{28}Ni_{36}Fe_{16}B_{20}$.

* * * * *